United States Patent
Hintersteiner (10) Patent No.: US 8,064,122 B2
(45) Date of Patent: Nov. 22, 2011

(54) APERTURED WINDOW FOR ENABLING FLEXIBLE ILLUMINATION OVERFILL OF PATTERNING DEVICES

(75) Inventor: Jason Douglas Hintersteiner, Norwalk, CT (US)

(73) Assignee: ASML Holding N.V., Veldhoven (NL)

( * ) Notice: Subject to any disclaimer, the term of this patent is extended or adjusted under 35 U.S.C. 154(b) by 452 days.

(21) Appl. No.: 11/686,743

(22) Filed: Mar. 15, 2007

(65) Prior Publication Data

US 2008/0226990 A1    Sep. 18, 2008

(51) Int. Cl.
G02B 26/00    (2006.01)
G03B 27/54    (2006.01)

(52) U.S. Cl. .......................................... 359/290; 355/67
(58) Field of Classification Search .................. 430/396; 355/53, 67, 71; 359/224.1, 290, 292, 738
See application file for complete search history.

(56) References Cited

U.S. PATENT DOCUMENTS

| | | | |
|---|---|---|---|
| 6,028,690 A * | 2/2000 | Carter et al. ............... | 359/224.1 |
| 6,287,732 B1 * | 9/2001 | Levenson ............................ | 430/5 |
| 6,667,837 B1 * | 12/2003 | Shockey ....................... | 359/738 |
| 6,762,868 B2 * | 7/2004 | Liu et al. ....................... | 359/237 |
| 6,906,847 B2 * | 6/2005 | Huibers et al. ................ | 359/291 |
| 6,937,382 B2 * | 8/2005 | Shih .............................. | 359/291 |
| 7,002,726 B2 | 2/2006 | Patel et al. | |
| 7,147,794 B2 | 12/2006 | Gasloli | |
| 7,180,573 B2 | 2/2007 | Lipson et al. | |
| 2002/0192403 A1 * | 12/2002 | Hanna .............................. | 428/34 |
| 2003/0101562 A1 * | 6/2003 | Hanna et al. ..................... | 29/412 |
| 2004/0247906 A1 | 12/2004 | Gasloli | |
| 2006/0033979 A1 | 2/2006 | Gupta et al. | |
| 2008/0080077 A1 * | 4/2008 | Shih et al. ...................... | 359/883 |
| 2009/0040595 A1 | 2/2009 | De Samber et al. | |

FOREIGN PATENT DOCUMENTS

| | | |
|---|---|---|
| JP | 2004-046134 A | 2/2004 |
| JP | 2006-011065 A | 1/2006 |
| JP | 2006-113594 A | 4/2006 |
| JP | 2006-528794 A | 12/2006 |
| JP | 2008-521024 A | 6/2008 |

OTHER PUBLICATIONS

English Language Abstract for JP 2004-046134 A, published Feb. 12, 2004; 1 page.

(Continued)

*Primary Examiner* — Hung Henry Nguyen
*Assistant Examiner* — Steven H Whitesell Gordon
(74) *Attorney, Agent, or Firm* — Sterne, Kessler, Goldstein & Fox P.L.L.C (57) ABSTRACT

A dark border region may be integrated with a window covering a patterning device, such that light from an active area of the patterning device passes through the dark border region, while excess light is removed from the system by the dark border region. The dark border region may be, for example and without limitation, a light-absorbing material, a wedged light reflective coating that reflects light out of the lithography system, or an interference grating that causes destructive interference in unwanted light to remove the unwanted light from the system. The dark border region may overlap a similar dark border region located on the surface of on the patterning device to optimize a width of the total dark border region without sacrificing excessive valuable real-estate area on the surface of the patterning device or compromising alignment tolerance levels of the lithography system.

18 Claims, 8 Drawing Sheets

OTHER PUBLICATIONS

English Language Abstract for JP 2006-011065 A, published Jan. 12, 2006; 1 page.
English Language Abstract for JP 2006-113594 A, published Apr. 27, 2006; 1 page.
English Translation of Notification of Reason(s) for Refusal directed to related Japanese Patent application No. 2008-061039, mailed on Jan. 11, 2011, from the Japanese Patent Office; 2 pages.

* cited by examiner

APERTURED WINDOW FOR ENABLING FLEXIBLE ILLUMINATION OVERFILL OF PATTERNING DEVICES

BACKGROUND

1. Field of the Invention

The present invention is directed generally to lithography. More particularly, the present invention relates to maskless lithography.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of an IC, flat panel display, or other device. This pattern can be transferred onto all or part of the substrate (e.g., a glass plate, a wafer, etc.), by imaging onto a layer of radiation-sensitive material (e.g., resist) provided on the substrate.

The patterning device can be used to generate, for example, an IC pattern. The patterning device can additionally or alternatively be used to generate other patterns, for example a color filter pattern or a matrix of dots. Instead of a mask, the patterning device can be a patterning array that comprises an array of individually controllable elements. The pattern can be changed more quickly and for less cost in such a system compared to a mask-based system.

A flat panel display substrate is typically rectangular in shape. A wafer substrate is typically circular in shape. Lithographic apparatus designed to expose substrates of these types can provide an exposure region that covers a full width of the substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

As is known, maskless lithography systems have been developed that replace a reticle with a patterning device including an array of individually controllable elements. The patterning device includes an active area or an array of active areas, each active area in the array having corresponding ones of the individually controllable elements, and inactive areas that include the control systems for controlling the individually controllable elements. The individually controllable elements are controlled to be positioned to form a desired pattern. These active elements are also known in the art as "pixels." A stored control algorithm based on a desired exposure pattern is used to control the pixels. Each pixel in the patterning device can vary its optical properties (e.g., amplitude/phase transmittance) in a controllable manner so as to provide a variation of a dose delivered to the substrate surface.

As maskless lithography capabilities increase, it is important to make as efficient use as possible of a beam of radiation (e.g., illumination light), while preventing excess light from reaching a projection system of the lithography system. To ensure that the active area of the patterning device is fully illuminated, a cross-sectional footprint of the illumination beam at the active area is typically larger than the size of the active area. Light that falls outside the active area (e.g., the overfill) is referred to herein as excess light. This excess light can enter the projection system as uncontrolled light and introduce errors and/or inconsistencies into the patterned beam of the lithography system.

Therefore, what is needed is a system and method for reducing lithography errors caused by excess light, while maximizing an active area of a patterning device.

BRIEF SUMMARY

A dark border region may be integrated with a window covering a patterning device of a lithography system, such that light from active areas of the patterning device passes through the dark border region, while excess light is removed from the lithography system using the dark border region. The dark border region may be, for example and without limitation, a light-absorbing material, a wedged light reflective coating that reflects light out of the lithography system, or an interference grating that causes destructive interference in unwanted light to remove the unwanted light from the lithography system. The dark border region may overlap a similar dark border region located on the surface of on the patterning device to optimize a width of the total dark border region without sacrificing excessive valuable real-estate area on the surface of the patterning device or compromising alignment tolerance levels of the lithography system.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. The drawing in which an element first appears is typically indicated by the leftmost digit(s) in the corresponding reference number.

DETAILED DESCRIPTION OF THE INVENTION

Overview

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

It is noted that references in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it would be within the knowledge of one skilled in the art to incorporate such a feature, structure, or characteristic in connection with other embodiments whether or not explicitly described.

Figure 1:
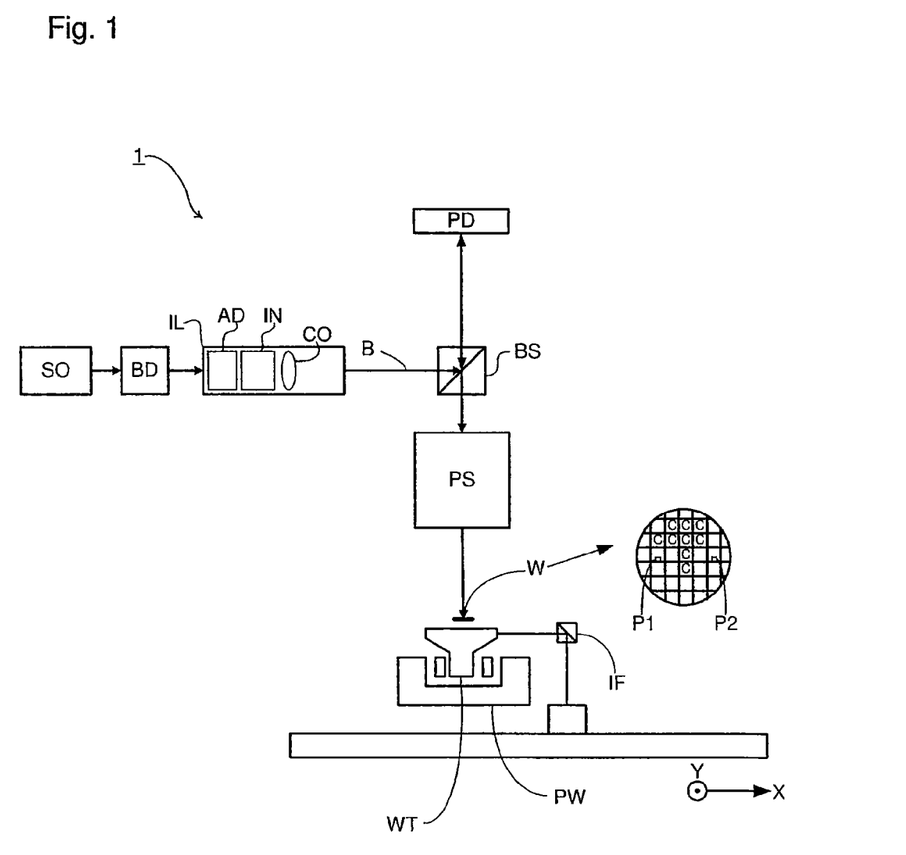
FIGS. 1 and 2 depict lithographic apparatus, according to various embodiments of the present invention.

FIG. 1 schematically depicts the lithographic apparatus 1 of one embodiment of the invention. The apparatus comprises an illumination system IL, a patterning device PD, a substrate table WT, and a projection system PS. The illumination system (illuminator) IL is configured to condition a radiation beam B (e.g., UV radiation).

It is to be appreciated that, although the description is directed to lithography, the patterning device PD can be formed in a display system (e.g., in a LCD television or projector), without departing from the scope of the present invention. Thus, the projected patterned beam can be projected onto many different types of objects, e.g., substrates, display devices, etc.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W. The term "projection system" used herein should be broadly interpreted as encompassing any type of projection system, including refractive, reflective, dioptric, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The illumination system can include various types of optical components, such as refractive, reflective, magnetic, electromagnetic, electrostatic or other types of optical components, or any combination thereof, for directing, shaping, or controlling radiation.

The patterning device PD (e.g., a reticle or mask or an array of individually controllable elements) modulates the beam. In general, the position of patterning device PD will be fixed relative to the projection system PS. However, it can instead be connected to a positioner configured to accurately position the array of individually controllable elements in accordance with certain parameters.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam cannot exactly correspond to the desired pattern in the target portion of the substrate, for example if the pattern includes phase-shifting features or so called assist features. Similarly, the pattern eventually generated on the substrate cannot correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "patterning devices." The patterning device comprises at least 10, at least 100, at least 1,000, at least 10,000, at least 100, 000, at least 1,000,000, or at least 10,000,000 programmable elements.

A programmable mirror array can comprise a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is composed of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction than unaddressed mirrors; in this manner, the reflected beam can be patterned according to the addressing pattern of the matrix-addressable mirrors. The required matrix addressing can be performed using suitable electronic means.

Another example a patterning device PD is a programmable LCD array.

The lithographic apparatus can comprise one or more patterning devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In one example, such as the embodiment depicted in FIG. 1, the substrate W has a substantially circular shape, optionally with a notch and/or a flattened edge along part of its perimeter. In another example, the substrate has a polygonal shape, e.g., a rectangular shape.

Examples where the substrate has a substantially circular shape include examples where the substrate has a diameter of at least 25 mm, at least 50 mm, at least 75 mm, at least 100 mm, at least 125 mm, at least 150 mm, at least 175 mm, at least 200 mm, at least 250 mm, or at least 300 mm. Alternatively, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, at least 2 sides or at least 3 sides, of the substrate has a length of at least 5 cm, at least 25 cm, at least 50 cm, at least 100 cm, at least 150 cm, at least 200 cm, or at least 250 cm.

At least one side of the substrate has a length of at most 1000 cm, at most 750 cm, at most 500 cm, at most 350 cm, at most 250 cm, at most 150 cm, or at most 75 cm.

In one example, the substrate W is a wafer, for instance a semiconductor wafer. The wafer material can be selected from the group consisting of Si, SiGe, SiGeC, SiC, Ge, GaAs, InP, and InAs. The wafer can be: a III/V compound semiconductor wafer, a silicon wafer, a ceramic substrate, a glass substrate, or a plastic substrate. The substrate can be transparent (for the naked human eye), colored, or absent a color.

The thickness of the substrate can vary and, to an extent, can depend on the substrate material and/or the substrate dimensions. The thickness can be at least 50 μm, at least 100 μm, at least 200 μm, at least 300 μm, at least 400 μm, at least 500 μm, or at least 600 μm. Alternatively, the thickness of the substrate can be at most 5000 μm, at most 3500 μm, at most 2500 μm, at most 1750 μm, at most 1250 μm, at most 1000 μm, at most 800 μm, at most 600 μm, at most 500 μm, at most 400 μm, or at most 300 μm.

The substrate referred to herein can be processed, before or after exposure. This processing can occur in, for example, a track (a tool that typically applies a layer of resist to a substrate and develops the exposed resist), a metrology tool, and/or an inspection tool. In one example, a resist layer is provided on the substrate.

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array to form the secondary sources and to image spots onto the substrate. The array of focusing elements (e.g., MLA) comprises at least 10 focus elements, at least 100 focus elements, at least 1,000 focus elements, at least 10,000 focus elements, at least 100,000 focus elements, or at least 1,000,000 focus elements.

The number of individually controllable elements in the patterning device is equal to or greater than the number of focusing elements in the array of focusing elements. One or more (e.g., 1,000 or more, the majority, or each) of the focusing elements in the array of focusing elements can be optically associated with one or more of the individually controllable elements in the array of individually controllable elements, with 2 or more, 3 or more, 5 or more, 10 or more, 20 or more, 25 or more, 35 or more, or 50 or more of the individually controllable elements in the array of individually controllable elements.

The MLA can be movable (e.g., with the use of one or more actuators) at least in the direction to and away from the substrate. Being able to move the MLA to and away from the substrate allows, e.g., for focus adjustment without having to move the substrate.

Figure 2:
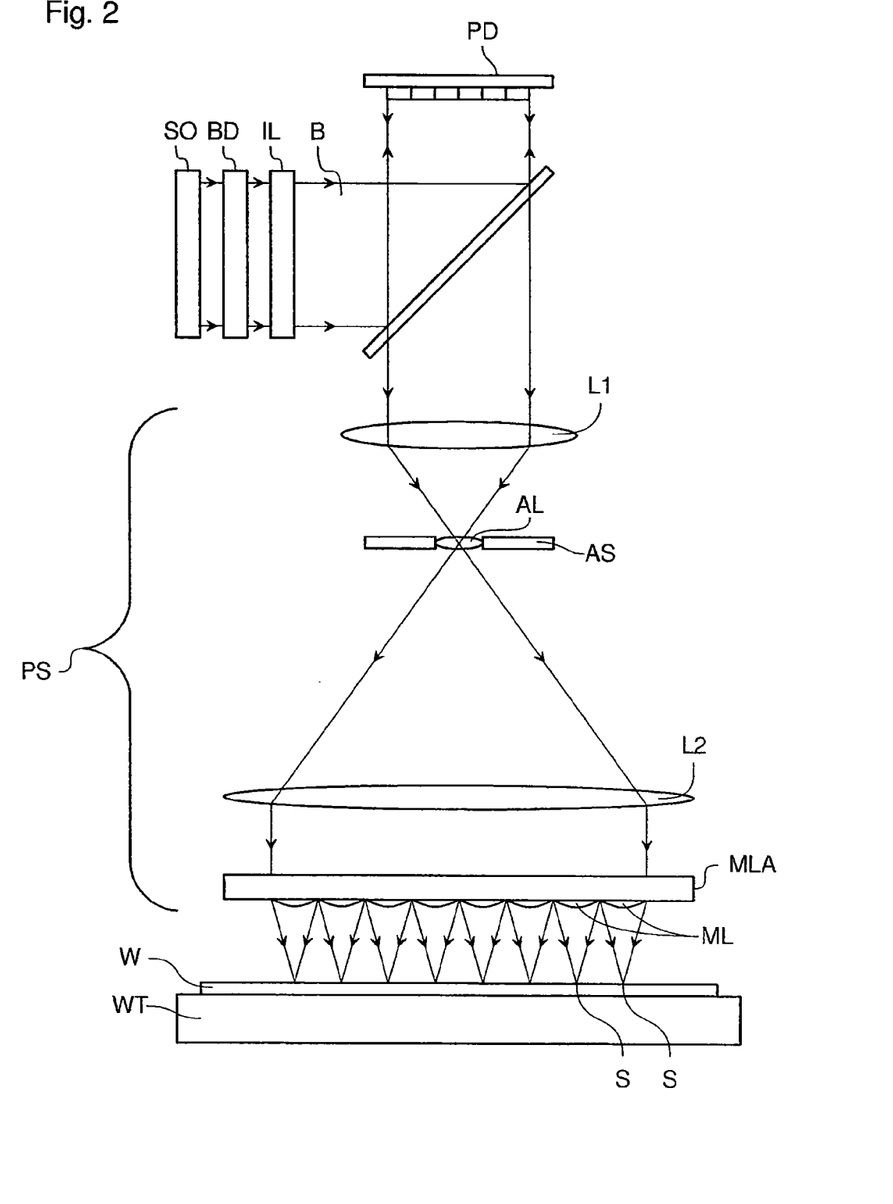

As herein depicted in FIGS. 1 and 2, the apparatus is of a reflective type (e.g., employing a reflective array of individually controllable elements). Alternatively, the apparatus can be of a transmissive type (e.g., employing a transmissive array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. The radiation source provides radiation having a wavelength of at least 5 nm, at least 10 nm, at least 11-13 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. Alternatively, the radiation provided by radiation source SO has a wavelength of at most 450 nm, at most 425 nm, at most 375 nm, at most 360 nm, at most 325 nm, at most 275 nm, at most 250 nm, at most 225 nm, at most 200 nm, or at most 175 nm. The radiation can have a wavelength including 436 nm, 405 nm, 365 nm, 355 nm, 248 nm, 193 nm, 157 nm, and/or 126 nm.

The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (coarse positioning) and a short-stroke module (fine positioning), which are not explicitly depicted in FIG. 1. In another example, a short stroke stage may not be present. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can be applicable in the manufacture of certain devices (e.g., flat panel displays), the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. The beam of radiation can be directed at the patterning device at an angle between 0 and 90°, between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 cannot be required if a transmissive patterning device is used.

The depicted apparatus can be used in several modes:

1. In step mode, the array of individually controllable elements and the substrate are kept essentially stationary, while an entire pattern imparted to the radiation beam is projected onto a target portion C at once (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes, the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be set to not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). At least 3, at least 4 radiation intensity values, at least 8 radiation intensity values, at least 16 radiation intensity values, at least 32 radiation intensity values, at least 64 radiation intensity values, at least 128 radiation intensity values, at least 256 different radiation intensity values, at least 512 different radiation intensity values, or at least 1024 different radiation intensity values can be projected onto the substrate.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. The radiation dose profile can have at least 2 desired dose levels, at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the patterning device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses ML in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses MLA are shown, the array of lenses MLA can comprise many thousands of lenses (the same is true of the array of individually controllable elements used as the patterning device PD).

Figure 3:
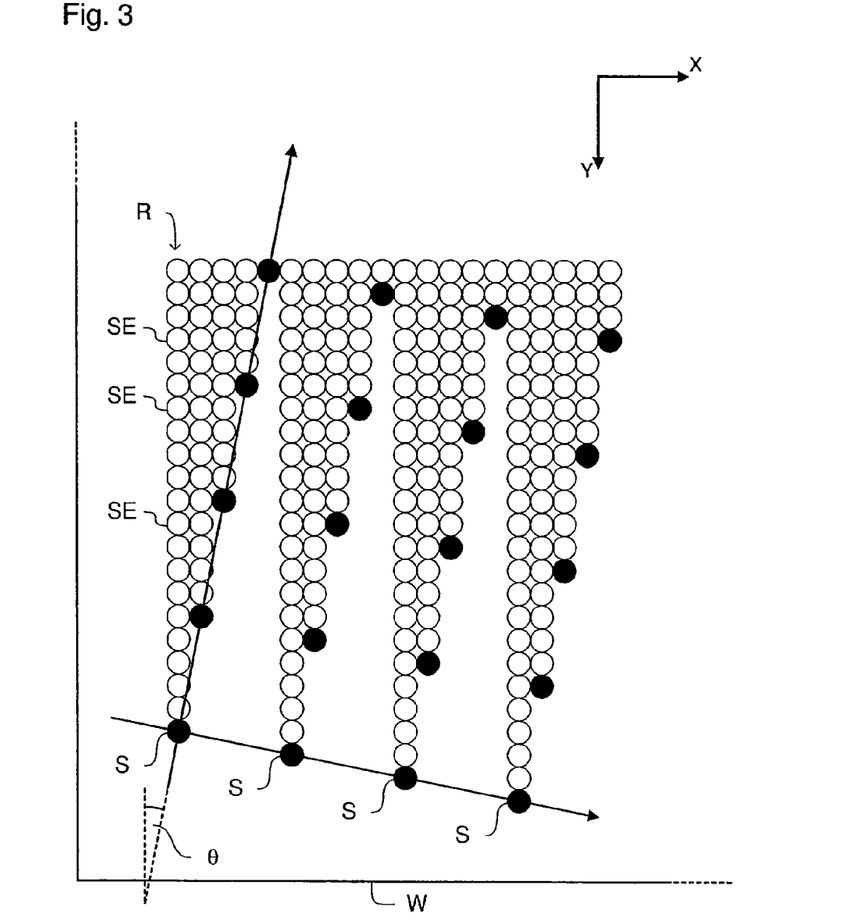
FIG. 3 depicts a mode of transferring a pattern to a substrate according to one embodiment of the invention as shown in FIG. 2.

FIG. 3 illustrates schematically how a pattern on a substrate W is generated using the system of FIG. 2, according to one embodiment of the present invention. The filled-in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle o relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots S. The angle θ can be at most 20°, at most 10°, at most 5°, at most 3°, at most 1°, at most 0.5°, at most 0.25°, at most 0.10°, at most 0.05°, or at most 0.01°. Alternatively, the angle θ is at least 0.001°.

Figure 4:
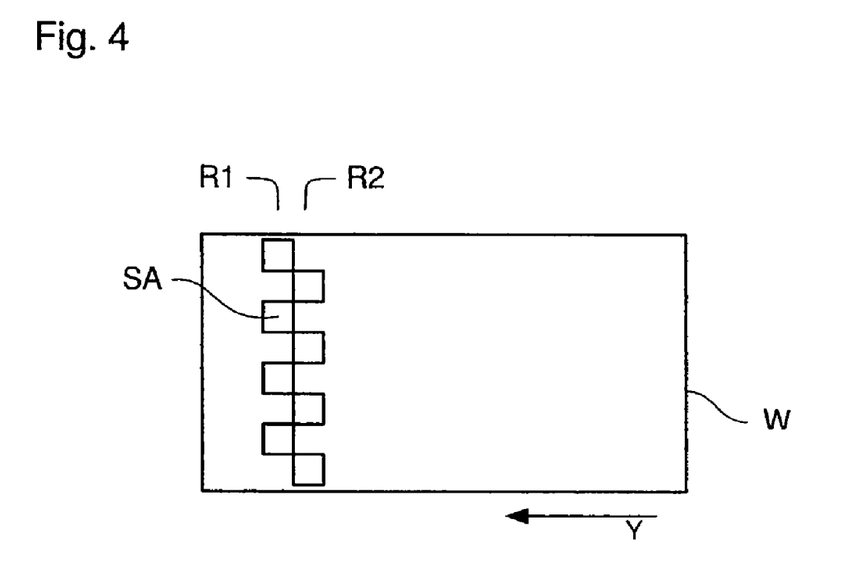
FIG. 4 depicts an arrangement of optical engines, according to one embodiment of the present invention.

FIG. 4 shows schematically how an entire substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots (e.g., spots S in FIG. 3) slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, at least 2, at least 4, at least 8, at least 10, at least 12, at least 14, or at least 17. Alternatively, the number of optical engines is less than 40, less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

Illumination Overfill

Figure 5:
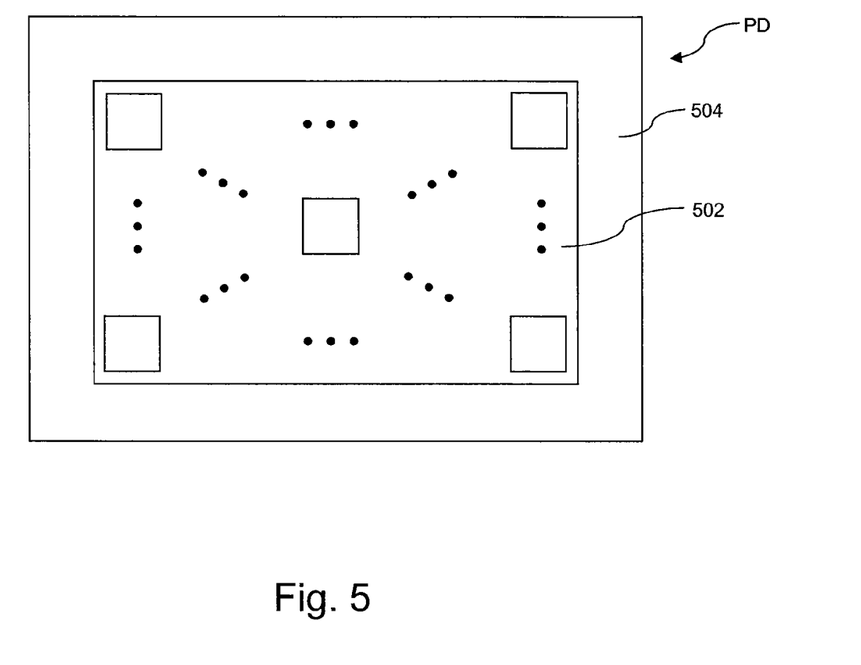
FIG. 5 is a front view of a patterning device according to an embodiment of the present invention.

FIG. 5 shows an exemplary patterning device PD having an array of individually controllable elements 501. The array of individually controllable elements 501 is collectively referred to herein as active area 502. Active area 502 may be surrounded by inactive packaging 504. To ensure that active area 502 is completely filled by an illumination light beam, a cross-sectional footprint of the illumination light beam may be slightly larger than active area 502 to account for any alignment tolerances and/or drifts. Light that interacts with active area 502 is considered useful; any remaining light (e.g., light that interacts with inactive packaging 504) is excess light which illuminates an overfill region.

Unless the excess light is removed from the lithography system, it is possible that the excess light may interact with a patterned beam formed when the illumination beam is patterned or modulated using the patterning device PD (e.g., an exposure beam) of the lithography system in an uncontrolled manner. For example, excess light incident upon inactive packaging 504 may reflect in an uncontrolled manner and enter the patterned beam, causing errors and/or inconsistencies in the illumination beam as the patterned beam passes through the projection system PS.

Figure 6:
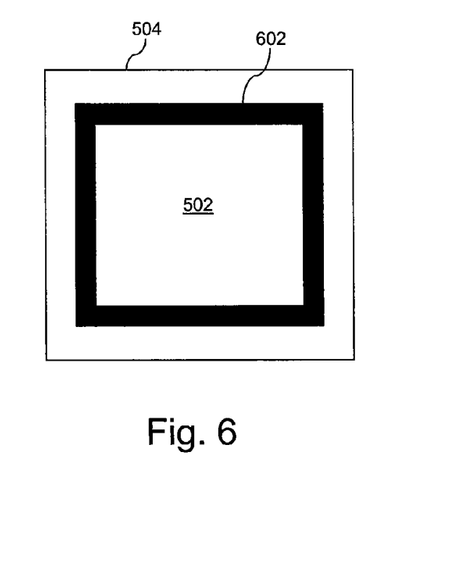
FIG. 6 is a front view of a patterning device having a dark border region according to an embodiment of the present invention.

FIG. 6 illustrates a device for removing excess light from the lithography system according to an embodiment of the present invention. As shown in FIG. 6, a dark border region 602 may be located on the surface of patterning device PD around active area 502. An inside perimeter of dark border region 602 is adjacent to an outside perimeter of active area 502. Dark border region 602 acts to remove light from the overfill region.

Previous devices similar to dark border region 602 utilize non-reflective coatings or elements to absorb excess light in the overfill region. However, such devices are subject to thermal distortion due to actinic heat load (e.g., heating due to light absorption). In turn, the device and/or the patterning device PD it is attached to can expand and possibly affect the quality of the light from the active area 502. Therefore, in one embodiment of the present invention, dark border region 602 is a reflective region that removes the excess light without subjecting patterning device PD to any side-effect of expansion due to heating. Dark border region 602 may be, for example, an interference grating etched onto patterning device PD to cause the excess light to destructively interfere, such that the excess light is removed from the system. The interference grating may, as an example, be etched onto patterning device PD as an array of phase-step mirrors on the surface of patterning device PD immediately adjacent to active area 502. In the example where phase-step mirrors are used, the phase of each mirror may differ by, e.g., a quarter-wavelength of the illumination light. In this manner, light incident on the phase-step mirrors destructively interferes and is removed from the system. The phase-step mirrors may be used with an active area that is also phase-stepped, or they may be used with an active area without phase steps.

Although dark border region 602 can remove excess light caused by overfill of active area 502, dark border region 602 takes up valuable real estate on the front of patterning device PD. Further, the outer perimeter of dark border region 602 is subject to a maximum size limitation, because the outer portions of patterning device PD may be utilized by other components of patterning device PD, such as, for example and without limitation, bond pads and mounts for temporary and permanent holders. Additionally, the inner perimeter of dark border region 602 is subject to a minimum size limitation, because space on patterning device PD is needed to maximize active area 502. Because of these constraints, dark border region 602 may be limited to a width of, for example, approximately 1 mm per side. However, to accommodate alignment offsets and drifts of the illuminator and/or illumination beam, a dark border area greater than approximately 1 mm may be needed.

To provide a dark border region having a larger width surrounding active area 502, a dark border region having an aperture may instead or in addition be placed in the optical path between the patterning device PD and the projection system PS. The dark border region may be offset from the patterning device PD at a standoff distance of, for example, less than approximately 3 mm.

Figure 7:
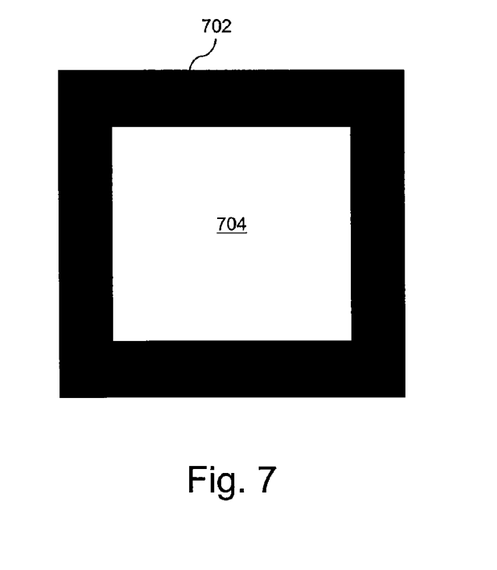
FIG. 7 is a front view of a dark border region having an aperture according to an embodiment of the present invention.

FIG. 7 is an illustration of an example dark border region 702 having an aperture 704. Patterning devices PD typically have a transparent window over their active area to allow light to reach the active area, while protecting the components of the active area from physical harm. Previous systems, such as those found in U.S. Published Patent Application Nos. 2004/0247906 and 2006/0033979, which are incorporated by reference herein in their entireties, added a non-reflective dark border region having a shape similar to that of dark border region 702 in addition to the transparent window. However, these previous systems use non-reflective, or absorptive, materials in their dark border regions. As discussed above with respect to FIG. 6, such absorptive materials can expand due to, for example, actinic heat load. This expansion can adversely affect the transmission of light from the active area from the patterning device PD.

Therefore, in an embodiment of the present invention, dark border region 702 reflects or substantially eliminates the excess light, so that there is minimal expansion of dark border region 702 due to heating caused by absorption of excess light. In one example, dark border region 702 is a ring of a reflective material, such as chrome. As will be further described with respect to FIG. 8B, the reflective material may be angled, or wedged, so as to reflect light away from the projection lens of the lithography system. In another example, dark border region 702 includes a reflective coating of a first material on a second material, such as, for example and without limitation, a chrome coating on a glass substrate.

The coating may be a dichroic coating. In yet another example, dark border region 702 includes an interference grating designed to destructively interfere light at the wavelength used in the lithography system. Such an interference grating may be, for example, phase-steps etched into a glass substrate.

Aperture 704 of dark border region 702 may be a transparent portion of a substrate used to create dark border region 702. Alternatively, aperture 704 may be a cut-out of the material used to create dark border region 702, such that dark border region 702 is made from a ring of the material. Dark border region 702 may be made from a variety of materials, including, for example and without limitation, glass or metal.

Dark border region 702 may have a width of any size, such as a width of 1 mm or greater. In an embodiment, dark border region 702 may be integrated with the transparent window that covers active area 502 of patterning device PD. In this embodiment, aperture 704 includes the transparent window. In another embodiment, dark border region 702 is a separate device from the transparent window. In this embodiment, the transparent window is offset from patterning device PD with a stand-off distance of, for example, less than approximately 3 mm, and dark border region 702 is further offset from the transparent window at a stand-off distance of, for example, approximately 3 mm. In such an embodiment, the patterning device PD window is located between patterning device PD and dark border region 702.

If dark border region 702 is used as the sole device to remove excess light from the lithography system, the inner perimeter of aperture 704 should be aligned with the outer perimeter of active area 502 on patterning device PD, such that substantially all of the excess light caused by illumination overfill is blocked or otherwise eliminated by dark border region 702. Alignment with the edges of active area 502 is also desired to ensure that light reflecting from or being passed through active area 502 is not clipped or otherwise truncated by dark border region 702.

Figure 8A:
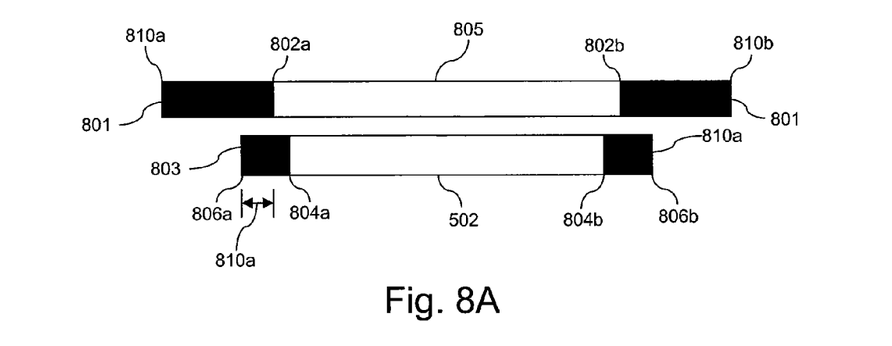
FIGS. 8A and 8B are cross-sections of a patterning device and offset dark border region according to embodiments of the present invention.

Additionally, or alternatively, to increase the alignment tolerance of dark border region 702, a dark border region similar to dark border region 702 may be used in conjunction with another device that removes excess light, such as a dark border region located on the surface of the patterning device PD. FIG. 8A is a cross-sectional illustration of a system 800 having a dark border region 801 and a dark border region 803 according to an embodiment of the present invention. Dark border region 801 has an aperture 805 and is similar to dark border region 702 (FIG. 7), and dark border region 803 is similar to dark border region 602 (FIG. 6). Dark border regions 801 and 803 may be made from, for example and without limitation, a light-absorbing material or a reflective material.

In FIG. 8A, the perimeter of dark border region 801 (e.g., edges 802a and 802b) in is larger than the perimeter of active area 502 (e.g., edges 804a and 804b) and smaller than the outer perimeter of dark border region 803 (e.g., edges 806a and 806b). This sizing allows dark border region 801 to overlap, but not completely cover, dark border region 803. This overlap is illustrated as example overlap 808. Because of overlap 808, dark border region 801 does not have to be perfectly aligned to active area 502. Instead, dark border region 801 can be slightly offset, tilted, and/or rotated without affecting the quality of the light passing through aperture 805. Further, because the size of aperture 805 is larger than the size of active area 502, the danger of light reflecting from or passing through active area 502 being clipped by dark border region 801 is reduced.

Use of dark border region 803 in conjunction with dark border region 801 allows excess light caused by illumination overfill to be removed, while minimizing real estate on the surface of patterning device PD. The width of dark border region 803 can be reduced to, for example, about 0.5 mm or smaller, while the width of dark border region 801 can be as large as needed for the illumination system. For example, an outer perimeter of dark border region 801 (e.g., edges 810a and 810b) may be approximately 1.2 mm or greater from the perimeter of active area 502, such that the combined width of overlapping dark border regions 801 and 803 is approximately 1.2 mm or greater starting from the edge of active area 502.

Figure 8B:
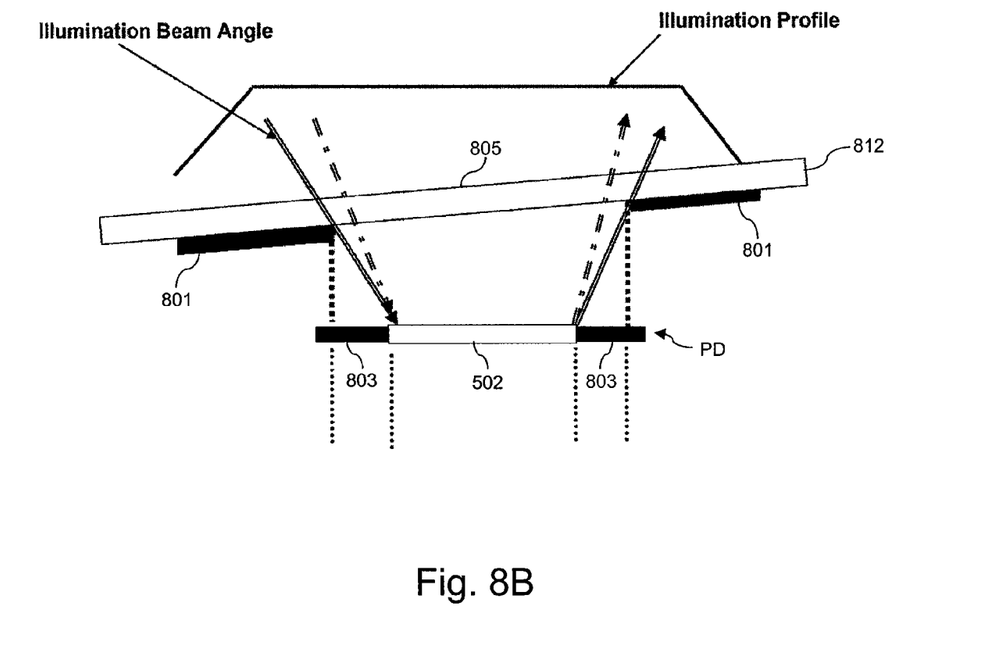

As illustrated in FIG. 8B, dark border region 801 may be angled, or wedged, with respect to active area 502 to reflect light out of the lithography system. Because dark border region 801 overlaps dark border region 803 and does not need to be precisely centered over active area 502, the amount and angles of light passing through aperture 805 is the same as when dark border region 801 is oriented parallel to active area 502. As further shown by FIG. 8B, dark border region 801 may be disposed on a transparent window 812 that covers patterning device PD.

Figure 9:
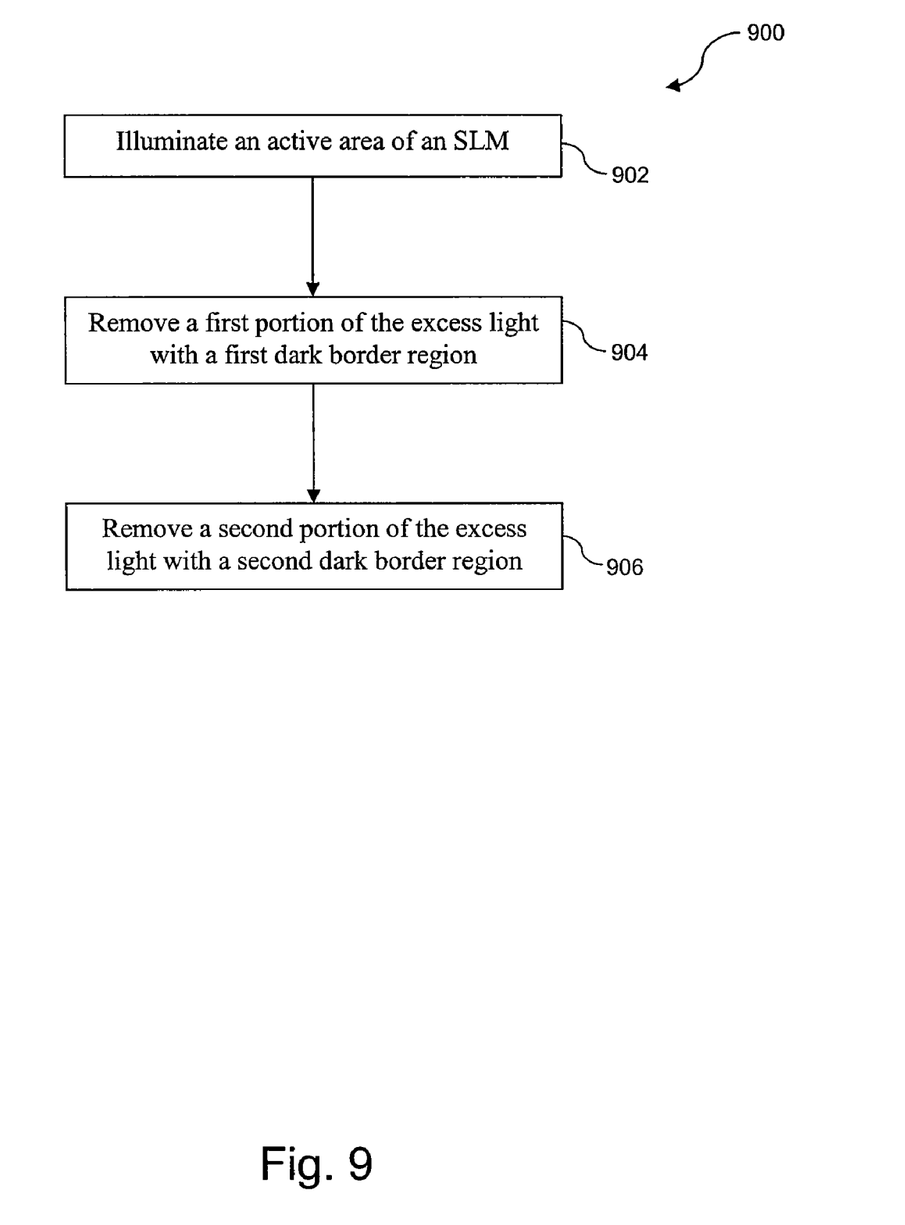
FIG. 9 is a flowchart of a method of removing excess light from a lithography system according to an embodiment of the present invention.

FIG. 9 is a flowchart of an exemplary method 900 for removing excess light caused by illumination overfill in a lithography system. Method 900 will be described with reference to system 800 of FIG. 8. In step 902, an active area of a patterning device, such as active area 502 of patterning device PD, is illuminated. The illumination may produce excess light due to illumination overfill of active area 502.

In step 904, a first portion of the excess light caused by illumination of the active area is removed with a first dark border region. The first dark border region may be located on the surface of the patterning device PD, such as dark border region 803 on patterning device PD. The first portion of excess light may include all of the excess light, or it may include only some of the excess light. If only some of the excess light is removed by the first dark border region, method 900 proceeds to step 906.

In step 906, a second portion of the excess light caused by illumination of the active area is removed with a second dark border region. The second dark border region may be offset from the surface of the patterning device PD, such as dark border region 801. Light passes through an aperture in the second dark border and into the projection system of the lithography system.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, e.g., a thin film transistor layer and/or a color filter layer.

Although specific reference is made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

Further, the purpose of the foregoing Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is not intended to be limiting as to the scope of the present invention in any way.

What is claimed is:

1. A system for reducing excess light in a lithography system, comprising:
    a patterning device having a substrate and an active area attached to the substrate, the active area comprising a plurality of patterning elements;
    a first dark border region located on the substrate of the patterning device and surrounding the active area, wherein the first dark border region is located substantially on a same plane as the active area; and
    a second dark border region offset from the substrate of the patterning device and surrounding the active area,
    wherein light exposed on the active area passes through an aperture in the second dark border region,
    wherein excess light exposed outside the active area is reduced using at least one of the first dark border region and the second dark border region and
    wherein an inner perimeter of the second dark border region is greater than an outer perimeter of the active area and less than an outer perimeter of the active area plus the first dark border region such that the second dark border region overlaps the first dark border region.

2. The system of claim 1, wherein an inner perimeter of the first dark border region is substantially adjacent to the perimeter of the active area.

3. The system of claim 1, wherein a width of the first dark border region is less than approximately 1.0 mm.

4. The system of claim 3, wherein the width of the first dark border region is less than approximately 0.5 mm.

5. The system of claim 1, wherein the outer perimeter of the second dark border region is approximately 1.2 mm from the outer perimeter of the active area.

6. The system of claim 1, wherein a combined width of the first dark border region and the overlapping second dark border region is greater than approximately 1.2 mm from the outer perimeter of the active area.

7. The system of claim 1, further comprising:
    a transparent window covering the active area of the patterning device and offset from the substrate of the patterning device.

8. The system of claim 7, wherein the second dark border region is integrated with the transparent window.

9. The system of claim 1, wherein the first dark border region comprises a reflective coating on the substrate of the patterning device.

10. The system of claim 1, wherein the first dark border region comprises an interference grating etched into the substrate of the patterning device.

11. The system of claim 1, wherein the first dark border region comprises an absorbing coating on the substrate of the patterning device.

12. The system of claim 1, wherein the second dark border region comprises a reflective region that reflects light out of the lithography system.

13. The system of claim 1, wherein the second dark border region comprises an interference grating that eliminates light at a wavelength used in the lithography system.

14. The system of claim 1, wherein the second dark border region comprises an absorbing coating that removes light from the lithography system.

15. The system of claim 1, wherein the active area is either transmissive or reflective.

16. The system of claim 1, wherein the second dark border region is angled or wedged with respect to the active area.

17. A patterning device, comprising:
    a substrate;
    an active area comprising a plurality of patterning elements attached to the substrate;
    a first dark border region located on the substrate of the patterning device and surrounding the active area, wherein the first dark border region is located substantially on a same plane as the active area; and
    a second dark border region offset from the substrate of the patterning device and surrounding the active area,
    wherein an inner perimeter of the second dark border region is greater than an outer perimeter of the active area and less than an outer perimeter of the active area plus the first dark border region, such that the second dark border region overlaps the first dark border region.

18. The patterning device of claim 17, wherein the second dark border region is angled or wedged with respect to the active area.

* * * * *